(12) United States Patent
Nagano

(10) Patent No.: US 7,304,320 B2
(45) Date of Patent: Dec. 4, 2007

(54) CHARGED BEAM EXPOSURE APPARATUS, CHARGED BEAM CONTROL METHOD AND MANUFACTURING METHOD OF SEMICONDUCTOR DEVICE

(75) Inventor: Osamu Nagano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 11/260,251

(22) Filed: Oct. 28, 2005

(65) Prior Publication Data

US 2006/0108546 A1    May 25, 2006

(30) Foreign Application Priority Data

Nov. 1, 2004    (JP)    ............. 2004-318193

(51) Int. Cl.
*H01J 37/08*    (2006.01)
(52) U.S. Cl. ................... 250/492.22; 250/492.23; 250/492.1; 250/492.2; 250/492.3; 250/306; 250/307; 250/309; 250/310; 250/399
(58) Field of Classification Search ............ 250/492.22
See application file for complete search history.

(56) References Cited

U.S. PATENT DOCUMENTS

| | | | | |
|---|---|---|---|---|
| 4,914,304 | A * | 4/1990 | Koyama ................. | 250/492.2 |
| 5,173,582 | A * | 12/1992 | Sakamoto et al. ...... | 219/121.25 |
| 5,843,603 | A * | 12/1998 | Ando et al. ............ | 430/30 |
| 6,232,612 | B1 * | 5/2001 | Nakajima ............... | 250/492.23 |
| 6,288,407 | B1 * | 9/2001 | Itoh ...................... | 250/492.23 |
| 6,642,675 | B2 * | 11/2003 | Ogasawara ............ | 315/370 |
| 6,723,973 | B2 * | 4/2004 | Saito ...................... | 250/492.22 |
| 6,777,698 | B2 * | 8/2004 | Ito ......................... | 250/492.23 |
| 6,815,698 | B2 * | 11/2004 | Nagano et al. ......... | 250/492.22 |
| 6,822,248 | B2 * | 11/2004 | Ferrera et al. ......... | 250/492.22 |
| 7,102,147 | B2 * | 9/2006 | Inanami et al. ........ | 250/492.23 |
| 7,109,501 | B2 * | 9/2006 | Nagano et al. ......... | 250/492.22 |
| 7,122,809 | B2 * | 10/2006 | Ogasawara ............. | 250/492.22 |
| 7,202,488 | B2 * | 4/2007 | Ota et al. ............... | 250/492.22 |

(Continued)

FOREIGN PATENT DOCUMENTS

JP    2000-173529    6/2000

(Continued)

*Primary Examiner*—David Vanore
*Assistant Examiner*—Bernard Souw
(74) *Attorney, Agent, or Firm*—Finnegan, Henderson, Farabow, Garrett & Dunner, L.L.P.

(57) ABSTRACT

A charged beam exposure apparatus includes: a first shaping aperture provided with a plurality of rectangular openings which are different from each other in at least one of area and shape thereof; a second shaping aperture provided with a pattern having a shape corresponding to that of a pattern to be drawn onto a substrate; a charged beam generator which generates a charged beam to apply the charged beam to the first shaping aperture; a projector which projects the charged beam that has passed through an arbitrary opening of the first shaping aperture onto the second shaping aperture; a deflection unit provided between the charged beam generator and the projector to deflect the charged beam; a deflection controller which controls the deflection unit so that the opening of the first shaping aperture is selected which enables adjustments of a drawing time and a resolution conforming to requirements/specifications of the pattern to be drawn; and a demagnification projector which projects the charged beam that has passed through the second shaping aperture onto the substrate in a demagnification form.

20 Claims, 11 Drawing Sheets

U.S. PATENT DOCUMENTS

| | | |
|---|---|---|
| 7,242,014 B2 * | 7/2007 | Ota et al. ................ 250/492.2 |
| 2002/0033458 A1 * | 3/2002 | Nagano et al. .......... 250/492.1 |
| 2003/0215722 A1 * | 11/2003 | Kanamitsu et al. ............ 430/5 |
| 2005/0072941 A1 * | 4/2005 | Tanimoto et al. ...... 250/492.22 |
| 2005/0109955 A1 * | 5/2005 | Nagano et al. ........ 250/492.21 |
| 2005/0133739 A1 * | 6/2005 | Ogasawara ............ 250/492.22 |
| 2006/0076508 A1 * | 4/2006 | Nakasugi et al. ........ 250/491.1 |
| 2006/0108546 A1 * | 5/2006 | Nagano ................. 250/492.22 |
| 2006/0243921 A1 * | 11/2006 | Inanami ................. 250/492.22 |

FOREIGN PATENT DOCUMENTS

| | | |
|---|---|---|
| JP | 2001-118771 | 4/2001 |
| JP | 2002-353128 | 12/2002 |

* cited by examiner

CHARGED BEAM EXPOSURE APPARATUS, CHARGED BEAM CONTROL METHOD AND MANUFACTURING METHOD OF SEMICONDUCTOR DEVICE

CROSS REFERENCE TO RELATED APPLICATION

This application claims benefit of priority under 35USC §119 to Japanese patent application No. 2004-318193, filed on Nov. 1, 2004, the contents of which are incorporated by reference herein.

BACKGROUND OF THE INVENTION

1. Field of the Invention

The present invention relates to a charged beam exposure apparatus, a charged beam control method and a manufacturing method of a semiconductor device.

2. Related Background Art

A charged beam exposure apparatus comprises a function of drawing a pattern with a high resolution because it is capable of drawing with a resolution on a wavelength level of charged particles (e.g., electrons or ions) shorter than a light wavelength. On the other hand, since the charged beam exposure apparatus directly draws a completed pattern with a small divided pattern beam in a manner different from that in a mask drawing method by light exposure, this apparatus has a problem that drawing takes a long time. However, as the charged beam exposure apparatus has a feature of being capable of forming a highly accurate thin line pattern, it has been making progress as a leading tool for a next technique of a light exposure type lithography technique or for manufacturing of semiconductors of many kinds in a small amount such as an application specific integrated circuit (ASIC). Methods of directly forming a pattern with an electron beam include a variable shaped beam (VSB) drawing method in which a pattern is drawn with an electron beam that has passed through a stencil aperture, as well as a method in which an entire wafer surface is scanned while turning on/off of a small circular beam is controlled to form a pattern. There has also been an electron beam drawing technique of a collective drawing type which has developed from the VSB drawing wherein repetitive patterns constitute one block, and a stencil is prepared in which the patterns corresponding to a plurality of blocks are formed, and then the stencil is selectively used to achieve high-speed drawing.

Since the VSB type electron beam exposure apparatus improves a beam resolution, there has heretofore been employed a method in which a highly accelerated electron beam is implanted into a resist on the wafer (e.g., Japan Patent Laid-open No. 2002-353128). Further, Japan Patent Laid-open No. 2002-353128 discloses a technique wherein current density is increased to increase a drawing speed, while a brightness control aperture provided with a plurality of opening patterns is disposed at a position where the electron beam forms a crossover in the vicinity of an exit of a condenser lens, in order to prevent a beam blur due to a space charge effect, and brightness is controlled by selecting the aperture.

However, in the high accelerating voltage method, a proximity effect occurs, and this is a phenomenon in which an applied electron beam is reflected by various kinds of multiplayer thin films formed on a lower surface of a resist on a wafer upper surface and again directed upward from the resist. As a result, the drawn pattern is blurred and the resolution is deteriorated. Thus, in the high accelerating voltage type charged beam exposure apparatus, control to compensate for the proximity effect is essential, thus requiring not only an optical system, but also a large-scale system in respect of control. Consequently, there has been a problem that the system is complicated to induce more troubles, leading to decreased accuracy. Moreover, since highly accelerated electrons are used, the wafer surface might be damaged.

In order to overcome the problems described above in the VSB method with a charged beam at a high accelerating voltage, an aperture type electron beam drawing method has been proposed which uses an electron beam at a low accelerating voltage (e.g., Japan Patent Laid-open No. 2000-173529).

In the highly accelerated charged beam exposure apparatus, the beam blur due to the space charge effect caused between a first shaping aperture and a second shaping aperture is at a negligibly low level, so that when high-resolution drawing is performed, the brightness can be controlled in accordance with an amount of a current passing through the second shaping aperture or most of the beam can be cut by variably shaping it in the second shaping aperture, thereby decreasing a beam current after the second shaping aperture to perform drawing.

However, in the low accelerated charged beam exposure apparatus, the beam blur due to the space charge effect caused between the first shaping aperture and the second shaping aperture is at a high level. To solve such a disadvantage, when the aperture for the brightness control is disposed at a crossover position to control brightness, for example, as shown in Patent document 1, there are problems that if the number of small openings is increased to obtain a uniform beam on a sample, contamination accumulated on a surface thereof changes an opening area to prevent a stable beam current from being obtained and that a charge-up is caused on the contamination to cause drift of the beam.

Furthermore, in Japan Patent Laid-open No. 2002-353128, a brightness control mechanism is disposed in a space of an illumination optical system closer to an electron beam gun side than the first shaping aperture. However, in the exposure apparatus using the electron beam at the low accelerating voltage, because the beam drift due to disturbance (a magnetic field, an electric field) is large, an optical system is reduced in size and a path of the electron beam is shortened to control the beam drift, so that it is difficult to newly and additionally provide a beam current control mechanism in the light path.

Still further, in a conventional electron beam exposure apparatus, a blanking operation is performed by a blanking deflector disposed on a wafer side of the first shaping aperture and by a blanking aperture. However, a voltage applied to a selective deflector can vary between its rising edge and falling edge. There has also been a problem that if this variance of timing satisfies a particular condition, the electron beam passes through the blanking aperture, and the resist on the water is unwillingly exposed to light.

SUMMARY OF THE INVENTION

According to a first aspect of the present invention, there is provided a charged beam exposure apparatus comprising:

a first shaping aperture provided with a plurality of rectangular openings which are different from each other in at least one of area and shape thereof;

a second shaping aperture provided with a pattern having a shape corresponding to that of a pattern to be drawn onto a substrate;

a charged beam generator which generates a charged beam to apply the charged beam to the first shaping aperture;

a projector which projects the charged beam that has passed through an arbitrary opening of the first shaping aperture onto the second shaping aperture;

a deflection unit provided between the charged beam generator and the projector to deflect the charged beam;

a deflection controller which controls the deflection unit so that the opening of the first shaping aperture is selected which enables adjustments of a drawing time and a resolution conforming to requirements/specifications of the pattern to be drawn; and a demagnification projector which projects the charged beam that has passed through the second shaping aperture onto the substrate in a demagnification form.

According to a second aspect of the present invention, there is provided a charged beam exposure apparatus comprising:

a first shaping aperture provided with a plurality of rectangular openings which are different from each other in at least one of area and shape thereof;

a second shaping aperture provided with a pattern having a shape corresponding to that of a pattern to be drawn onto a substrate;

a charged beam generator which generates a charged beam to apply the charged beam to the first shaping aperture;

a projector which projects the charged beam that has passed through an arbitrary opening of the first shaping aperture onto the second shaping aperture;

a deflection unit provided between the charged beam generator and the projector to deflect the charged beam;

a blanking unit which selectively controls turning on/off of application of the charged beam to the substrate by deflecting the charged beam;

a deflection controller which controls the deflection unit so that the charged beam is deflected in a direction orthogonal to a direction of deflection by the blanking unit to cause the charged beam to selectively pass through the arbitrary opening; and a demagnification projector which projects the charged beam that has passed through the second shaping aperture onto the substrate in a demagnification form.

According to a third aspect of the present invention, there is provided a charged beam exposure apparatus comprising:

a first shaping aperture provided with a plurality of rectangular openings which are different from each other in at least one of area and shape thereof;

a second shaping aperture provided with a pattern having a shape corresponding to that of a pattern to be drawn onto a substrate;

a charged beam generator which generates a charged beam to apply the charged beam to the first shaping aperture;

a projector which projects the charged beam that has passed through an arbitrary opening of the first shaping aperture onto the second shaping aperture;

a demagnification projector which projects the charged beam that has passed through the second shaping aperture onto the substrate in a demagnification form;

a blanking unit which selectively controls turning on/off of application of the charged beam to the substrate by deflecting the charged beam;

a deflection unit including first and second deflectors disposed closer to the charged beam generator side than the first shaping aperture in an optical axis direction of the charged beam to apply the charged beam to the arbitrary opening by deflecting the charged beam, and further including a third deflector disposed closer to the substrate side than the first shaping aperture to reverse the charged beam that has passed through the opening to the optical axis side;

a deflection controller which controls the deflection unit so that the charged beam selectively passes through the arbitrary opening; and a timing control unit which controls the deflection unit so that the first to third deflectors operate at different timings.

According to a fourth aspect of the present invention, there is provided a charged beam control method comprising:

generating a charged beam and applying the charged beam to an arbitrary opening of a first shaping aperture provided with a plurality of rectangular openings which are different from each other in at least one of area and shape thereof;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form; and deflecting the charged beam so that the opening of the first shaping aperture is selected as an opening of the first shaping aperture through which the charged beam passes to enable adjustments of a drawing time and a resolution conforming to requirements/specifications of the pattern to be drawn.

According to a fifth aspect of the present invention, there is provided a charged beam control method comprising:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam; and deflecting the generated charged beam in a direction orthogonal to a direction of deflection by the blanking deflection to cause the charged beam to selectively pass through the arbitrary opening of the first shaping aperture.

According to a sixth aspect of the present invention, there is provided a charged beam control method comprising:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam;

a first and a second deflections to deflect the charged beam so that the generated charged beam selectively passes through the arbitrary opening of the first shaping aperture, and a third deflection to reverse the charged beam that has passed through the arbitrary opening to the optical axis side; and carrying out the first to third deflections at different timings.

According to a seventh aspect of the present invention, there is provided a manufacturing method of a semiconductor device comprising drawing a pattern on a substrate by use of a charged beam control method which includes:

generating a charged beam and applying the charged beam to an arbitrary opening of a first shaping aperture provided with a plurality of rectangular openings which are different from each other in at least one of area and shape thereof;

projecting the charged beam that has passed through the arbitrary opening of the first shaping aperture to a second shaping aperture provided with a pattern having a shape corresponding to that of the pattern to be drawn onto the substrate;

projecting the charged beam that has passed through the pattern of the second shaping aperture onto the substrate in a demagnification form; and deflecting the charged beam so that the opening of the first shaping aperture is selected as an opening of the first shaping aperture through which the charged beam passes to enable adjustments of a drawing time and a resolution conforming to requirements/specifications of the pattern to be drawn.

According to an eighth aspect of the present invention, there is provided a manufacturing method of a semiconductor device comprising drawing a pattern on a substrate by use of a charged beam control method which includes:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam; and deflecting the generated charged beam in a direction orthogonal to a direction of deflection by the blanking deflection to cause the charged beam to selectively pass through the arbitrary opening of the first shaping aperture.

According to a ninth aspect of the present invention, there is provided a manufacturing method of a semiconductor device comprising drawing a pattern on a substrate by use of a charged beam control method which includes:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam;

a first and a second deflections to deflect the charged beam so that the generated charged beam selectively passes through the arbitrary opening of the first shaping aperture, and a third deflection to reverse the charged beam that has passed through the arbitrary opening to the optical axis side; and carrying out the first to third deflections at different timings.

DETAILED DESCRIPTION OF THE INVENTION

Figure 1:
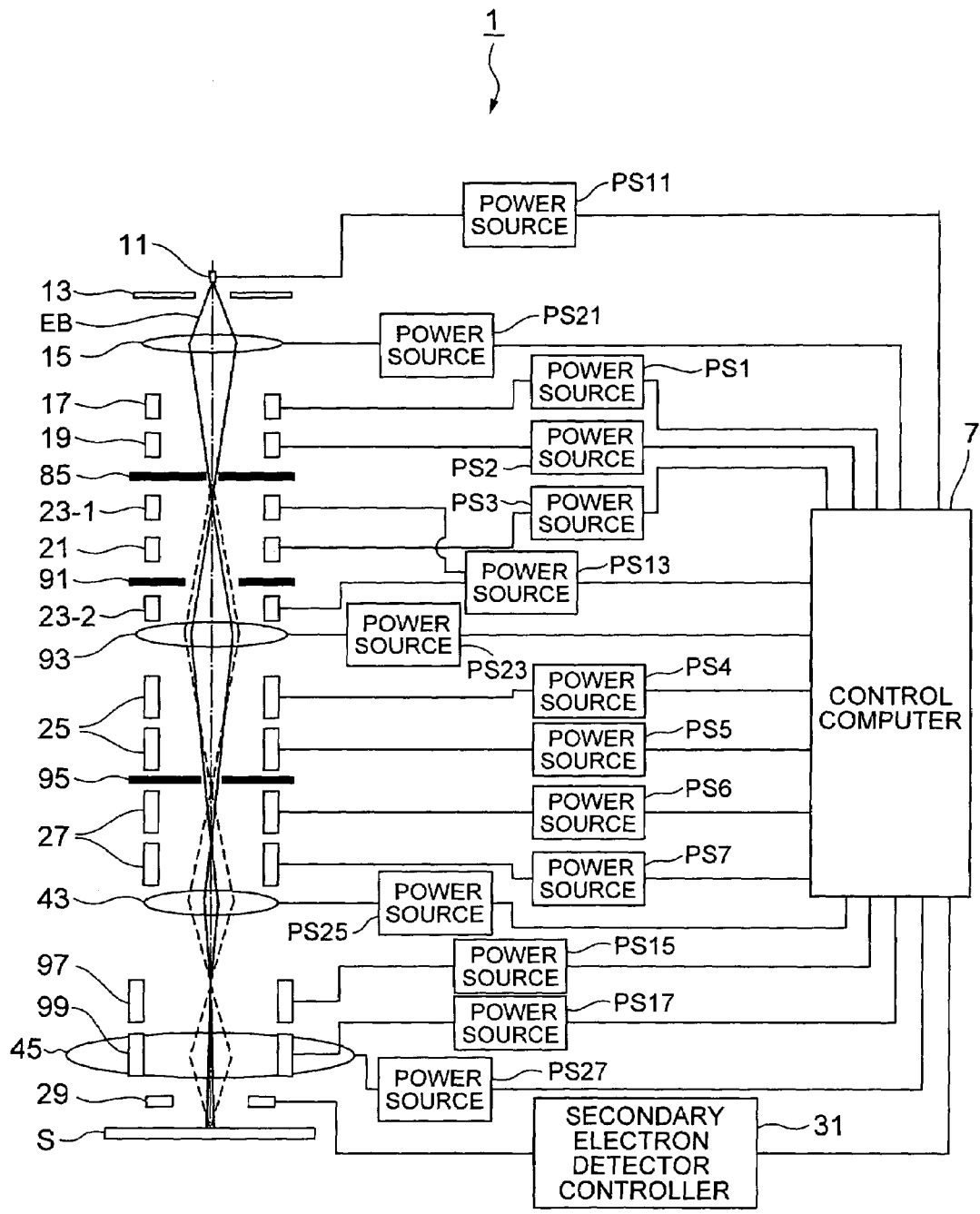
FIG. 1 is a block diagram showing a schematic configuration of a charged beam exposure apparatus according to a first embodiment of the present invention.

Embodiments of the present invention will hereinafter be described referring to the drawings. An electron beam exposure apparatus will be described below as an example of a charged beam exposure apparatus, but the present invention is not limited thereto, and it goes without saying that the present invention is also applicable to an exposure device using, for example, an ion beam as a charged beam. In the drawings, the same reference numerals are assigned to the same parts, and a redundant explanation is made only when necessary.

(1) First Embodiment

FIG. 1 is a block diagram showing a schematic configuration of a charged beam exposure apparatus according to a first embodiment of the present invention. The present embodiment is characterized in that a first shaping aperture 85 is provided with a plurality of openings different from each other in at least one of area and shape and that voltages applied to deflectors 17, 19 are controlled so that the opening of the first shaping aperture 85 is selected in accordance with a resolution required for a drawn pattern. These characteristics will later be described in detail, and a configuration and operation of the charged beam exposure apparatus of the present embodiment will first be schematically described.

An electron beam exposure apparatus 1 shown in FIG. 1 comprises an optical system, a control computer 7, various power sources PS1 to 7, PS11, PS13, PS15, PS17, PS21, PS23, PS25, PS27, and a secondary electron detector controller 31.

The control computer 7 controls the entire apparatus, and also controls the power sources PS1, 2 so that an arbitrary opening of the first shaping aperture 85 is selected by the deflectors 17, 19 to apply an electron beam EB, as described later. In the present embodiment, the control computer 7 corresponds to, for example, a deflection controller and a focus position corrector.

The various power sources PS1 to 7, PS11, PS13, PS15, PS17, PS21, PS23, PS25 and PS27 are connected to corresponding components of the optical system and to the control computer 7, and apply voltages to these components in accordance with control signals provided from the control computer 7.

The secondary electron detector controller 31 is connected to a secondary electron detector 29 described later and the control computer 7, and receives and processes a signal of secondary electrons detected by the secondary electron detector 29, and then transmits it in a form of signals constituting a scanning electron microscope (SEM) image to the control computer 7.

The optical system includes an electron beam gun 11 which generates the electron beam EB, a first aperture 13 having rectangular or circular openings, an illumination lens 15, the selective deflectors 17, 19, the first shaping aperture 85 characteristic of the present embodiment, blanking electrodes 23-1, 23-2, a reversing deflector 21, a blanking aperture 91, a projection lens 93, a first shaping deflector 25, a second shaping aperture 95, a second shaping deflector 27, a demagnification lens 43, a sub deflector 97, a main deflector 99, an objective lens 45, and the secondary electron detector 29. In the present embodiment, the projection lens 93 corresponds to, for example, a projector, and the demagnification lens 43 and the objective lens 45 correspond to, for example, a demagnification projector. Further, in the present embodiment, the selective deflectors 17, 19 and the reversing deflector 21 correspond to, for example, first to third deflectors, respectively, and these deflectors 17, 19, 21 and the power sources PS1 to 3 connected to these deflectors correspond to, for example, a deflection unit. Still further, in the present embodiment, the blanking electrodes 23-1, 23-2 and the blanking aperture 91 correspond to, for example, a blanking unit.

The illumination lens 15 is constituted of two electrostatic lenses (Einzel lenses), and these lenses are used so that a negative voltage from the power source PS21 is applied to their central electrodes. The illumination lens 15 adjusts magnification of the electron beam EB such that the electron beam EB is sufficiently large for the openings of the first shaping aperture 85 and has a beam diameter of a necessary size. The first shaping aperture 85 is provided with a plurality of rectangular openings different from each other in at least one of area and shape. This will be described later in detail.

The selective deflectors 17, 19 deflect/control the electron beam EB so that the electron beam EB that has passed through the illumination lens 13 enters an arbitrary rectangular opening of the first shaping aperture 85.

The reversing deflector 21 reverses the electron beam EB that has passed through the first shaping aperture 85 to its optical axis.

The electron beam EB that has passed through the first shaping aperture 85 starts as a rectangular beam originating from the first shaping aperture 85, and its aperture image is projected to the second shaping aperture 95 by the projection lens 93.

The blanking electrodes 23-1, 23-2 excite an electric field produced by a voltage applied from the power source PS13 to perform blanking deflection for the electron beam EB, and control, together with the blanking aperture 91, turning on/off of the electron beam EB traveling onto a wafer S.

The first shaping deflector 25 deflects/controls the electron beam EB in accordance with CAD data so that the electron beam EB that has passed through the projection lens 93 enters a desired cell pattern having a desired area of the second shaping aperture 95. The second shaping deflector 27 reverses the electron beam EB that has passed through the second shaping aperture 95 onto its optical axis.

The electron beam EB that has passed through the first shaping deflector 25, the second shaping aperture 95 and the second shaping deflector 27 starts as a cell pattern beam originating from the second shaping aperture 95, and passes through the demagnification lens 43 and the objective lens 45 in a state reversed onto the optical axis, thereby being projected onto the wafer S in a reduced form. The demagnification lens 43 demagnifies a cell pattern image originating from the second shaping aperture 95. The objective lens 45 further demagnifies the reduced cell pattern image to form it on the wafer S.

The main deflector 99 deflects/controls a trajectory of the electron beam EB by a voltage applied from the power source PS17 so that a drawing area (stripe) of the wafer S is scanned. The sub deflector 97 controls an application position of the electron beam EB within a drawing area subdivided from an area in the stripe.

The secondary electron detector 29 is disposed between the objective lens 45 and the wafer S, and detects the secondary electrons produced from a surface of the wafer S by the application of the electron beam EB. The secondary electron detector controller 31 processes a detected signal to supply it to the control computer 7, and the control computer 7 detects the SEM image from the processed signal, and uses it for control such as a beam adjustment.

Figure 2:
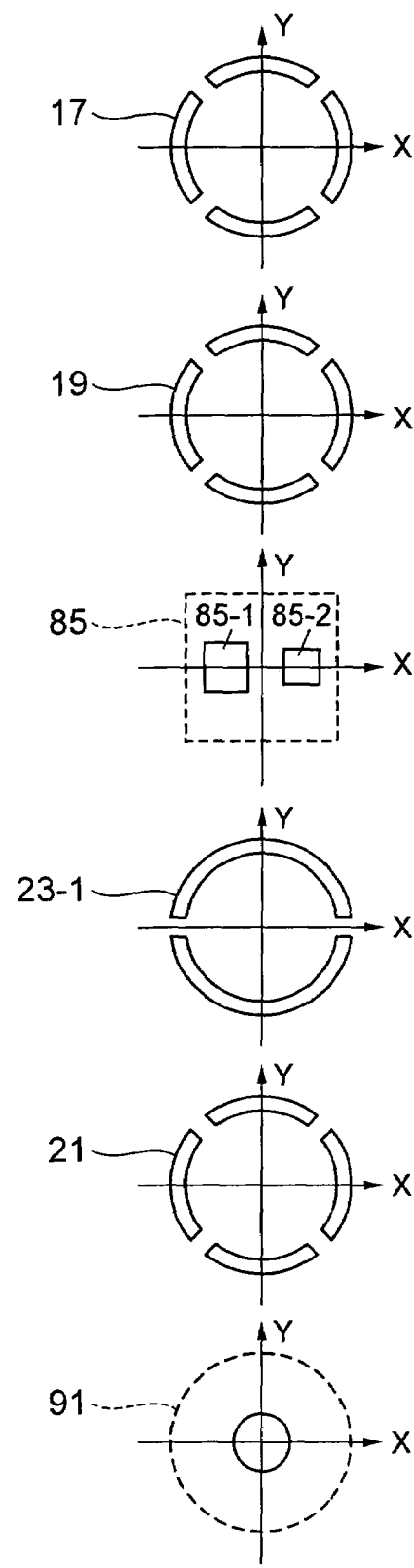
FIG. 2 is an explanatory diagram showing plane shapes and relative location of essential parts of an optical system in the charged beam exposure apparatus shown in FIG. 1.

FIG. 1 shows a configuration of the optical system using a cut surface along an X-Z plane when the optical axis is defined in a Z direction. Plane shapes of essential parts of the optical system are shown in FIG. 2. In FIG. 2, the essential parts are shown in a manner vertically arranged in the drawing so that Y axes in plan views are aligned in order to explain a positional relationship among these essential parts.

Figure 3:
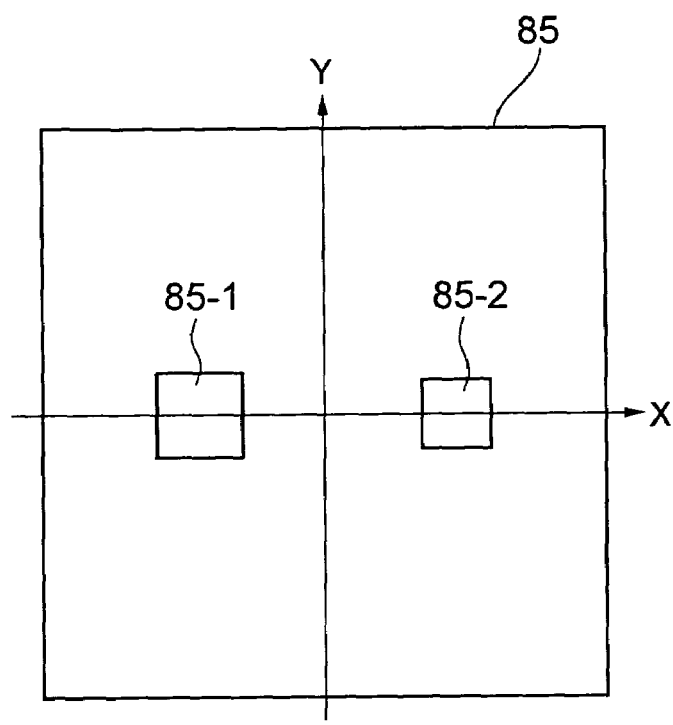
FIG. 3 is a plan view of a first shaping aperture which the charged beam exposure apparatus shown in FIG. 1 comprises.
Figure 4:
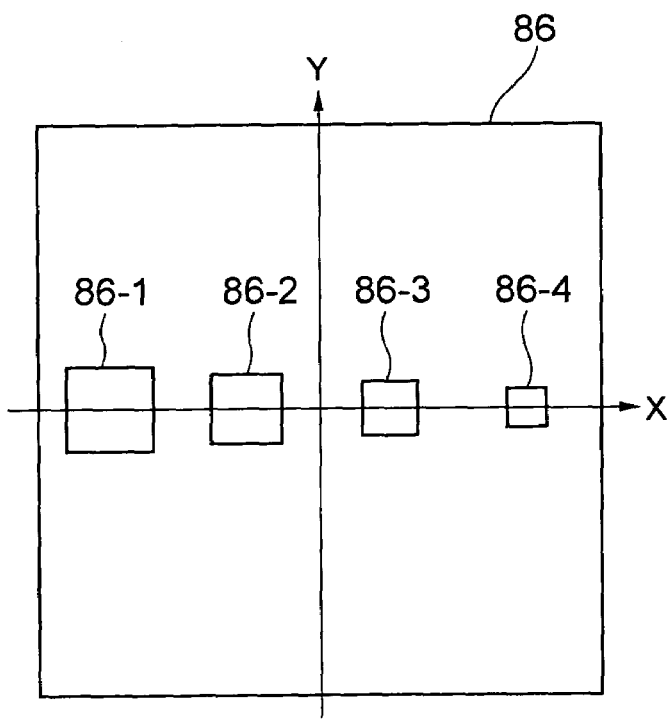
FIGS. 4 to 7 are plan views showing other examples of the first shaping aperture provided in the optical system of the charged beam exposure apparatus shown in FIG. 1.
Figure 5:
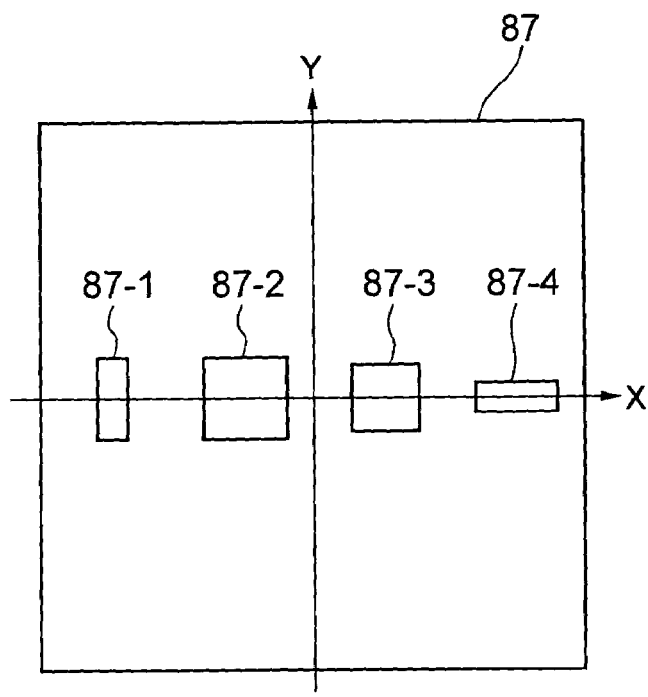

FIG. 3 shows a plan view of the first shaping aperture 85 provided in the optical system of the electron beam exposure apparatus 1 shown in FIG. 1. In an example shown in FIG. 3, two square openings 85-1, 86-2 having different areas are arranged on an X axis substantially in line symmetry with respect to a Y axis. The first shaping aperture that can be placed in the optical system of the electron beam exposure apparatus 1 is not limited to the shape shown in FIG. 3, and may be in any shape as long as it is provided with a plurality of rectangular openings different from each other in at least one of area and shape. Other examples of the first shaping aperture are shown in plan views of FIGS. 4 to 7. In a first shaping aperture 86 shown in FIG. 4, four square openings 86-1 to 86-4 on the X axis are arranged from the left to right in the drawing in descending order of area. A first shaping aperture 87 shown in FIG. 5 includes two square openings 87-2, 87-3 arranged on the X axis substantially in line symmetry with respect to the Y axis in the vicinity of a center, and additionally includes two rectangular openings 87-1, 87-4 arranged on the X axis on the outside the square openings 87-2, 87-3 so as to sandwich the openings 87-2, 87-3. A longitudinal direction of the rectangular opening 87-4 corresponds to an X-axis direction, but the rectangular opening 87-1 is formed so that its longitudinal direction is in a Y-axis direction. A first shaping aperture 88 shown in FIG. 6 includes four square openings 88-1 to 88-4 arranged on the X axis and Y axis so as to be rotationally symmetric to each other around an intersection of the X axis and Y axis.

Each of the openings is disposed on the X axis or Y axis in the four examples described above, but the present invention is not limited to this arrangement form. For example, as shown in a first shaping aperture 89 shown in FIG. 7, square or rectangular openings 89-1, 89-3, 89-9 may be arranged at positions away from the X axis and Y axis. Moreover, directions in which the openings are arranged are not particularly limited to the X-axis direction or Y-axis direction. For example, the openings can be arranged in arbitrary directions as openings 89-7, 89-8 in FIG. 7.

Here, if the rectangular opening having a large area is selected, a current amount of the electron beam EB passing through the first shaping aperture will increase. On the other hand, when the rectangular opening having a small area is selected, the current amount of the electron beam EB passing through the first shaping aperture will decrease. In this way, due to a difference in the current amount of the electron beam EB passing through the first shaping aperture, an amount of occurrence of a space charge effect varies, and an amount of defocus on the second shaping aperture 95 varies, with the result that a large amount of defocus might be caused to decrease the resolution depending on the selected opening. In the present embodiment, the control computer 7 generates a control signal in accordance with the area of the rectangular opening selected in the first shaping aperture and supplies the control signal to the power source PS23, and in response to this control signal, the power source PS23 adjusts a voltage applied to the projection lens 93. Thus, the defocus in the second shaping aperture is eliminated.

Figure 8:
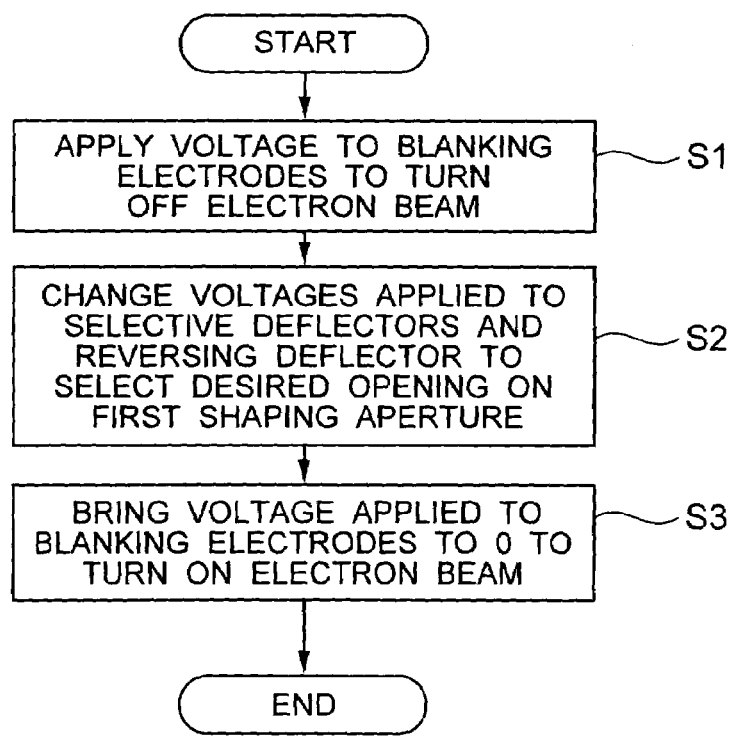
FIG. 8 is a flowchart showing a specific procedure of selecting a rectangular opening in the first shaping aperture provided in the charged beam exposure apparatus shown in FIG. 1.
Figure 9:
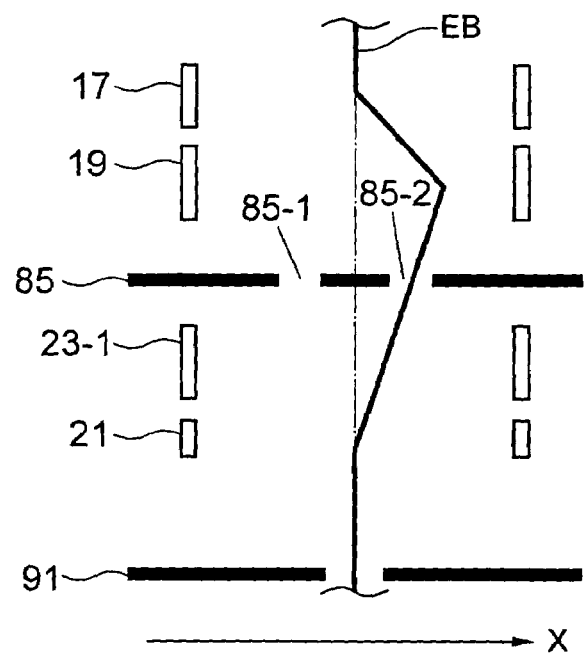
FIG. 9 is a diagram showing one example of a trajectory of a charged beam of the charged beam exposure apparatus shown in FIG. 1.
Figure 10:
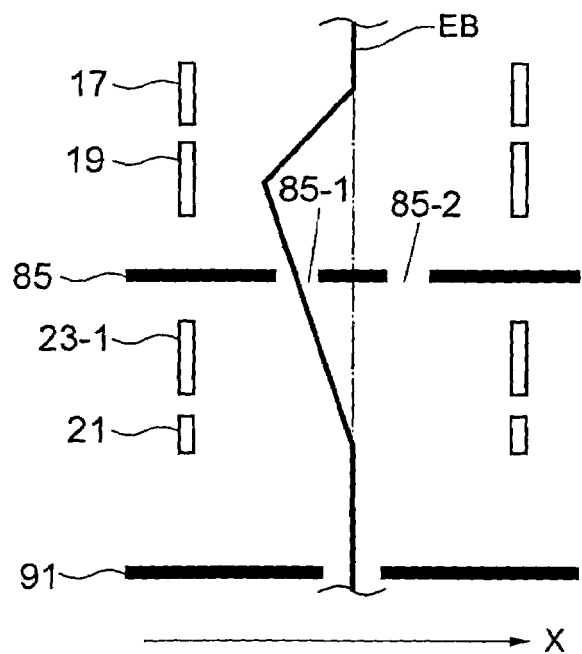
FIG. 10 is a diagram showing another example of the trajectory of the charged beam of the charged beam exposure apparatus shown in FIG. 1.

A method of selecting the rectangular opening provided in the first shaping aperture will be described referring to FIG. 8 to FIG. 10. FIG. 8 is a flowchart showing a specific procedure of selecting the rectangular opening, and FIG. 9 and FIG. 10 show the trajectories of a charged beam passing through the selected rectangular opening.

First, by applying a voltage from the power source PS13 to the blanking electrodes 23-1, 23-2, the electron beam EB reaching the wafer is turned off (FIG. 8, step S1). Next, each of the power sources PS1 to PS3 is adjusted in accordance with the rectangular opening to be selected to change voltages applied to the selective deflectors 17, 19 and the reversing deflector 21, thereby causing the electron beam EB to enter the selected rectangular opening (FIG. 8, step S2). Finally, the voltage applied to the blanking electrodes 23-1, 23-2 from the power source PS13 is brought to zero to turn on the electron beam EB reaching the wafer S (FIG. 8, step S3). FIG. 9 shows one example of the beam trajectory when the electron beam EB is deflected in the X-axis direction to select the rectangular opening 85-2. FIG. 10 shows one example of the beam trajectory when the electron beam EB is deflected in the X-axis direction to select the rectangular opening 85-1.

Figure 11:
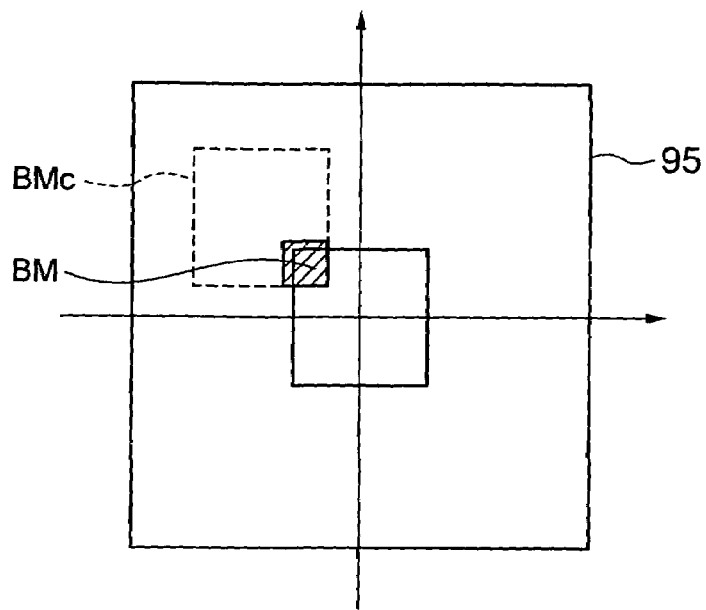
FIG. 11 is an explanatory diagram showing one example of an effect of the charged beam exposure apparatus shown in FIG. 1.

If the rectangular opening having a large area is selected, a current of the electron beam EB passing through the first shaping aperture is high, and thus a beam blur due to the space charge effect occurs to a great extent, which is deterioration in terms of resolution. However, this allows a larger shot size, and makes it possible to shorten drawing time. On the other hand, when, for example, the rectangular opening having the smallest area is selected among the rectangular openings which enable the passed electron beam EB to illuminate a desired area on the second shaping aperture 95, a longer drawing time is taken due to a small shot size. However, because the current amount of the passing beam is small, the beam blur due to the space charge effect is decreased, which allows drawing with a high resolution. Thus, according to the present embodiment, since an arbitrary opening can be selected from the plurality of openings different from each other in at least one of area and shape, the resolution and the drawing time that are originally in a trade-off relation can be adjusted in accordance with requirements/specifications of the drawn pattern. When the small opening is selected, for example, the current amount of the beam that has passed through the first shaping aperture 85 and shut off by the second shaping aperture 95 can be decreased as compared with a case where a conventional rectangular opening is selected (dotted line area indicated by a sign BMc), as indicated by a shaded area BM in FIG. 11. Thus, the beam blur due to the space charge effect is restrained, and the drawing with a high resolution can be achieved.

The voltage applications to the selective deflectors 17, 19 and the reversing deflector 21 are theoretically performed at the same time, for example, in step S2 in the flowchart of FIG. 8 among the steps of selecting the rectangular opening described above. However, in actuality, a blanking error can occur because the voltages applied to the respective deflectors are different and because there is a difference in rising times and falling times of the voltages due to a mechanical difference among the power sources. Especially, when the voltages of these power sources are changed at a high speed, polarities of the applied voltages and a voltage ratio among the deflectors can be temporarily disrupted.

Figure 12:
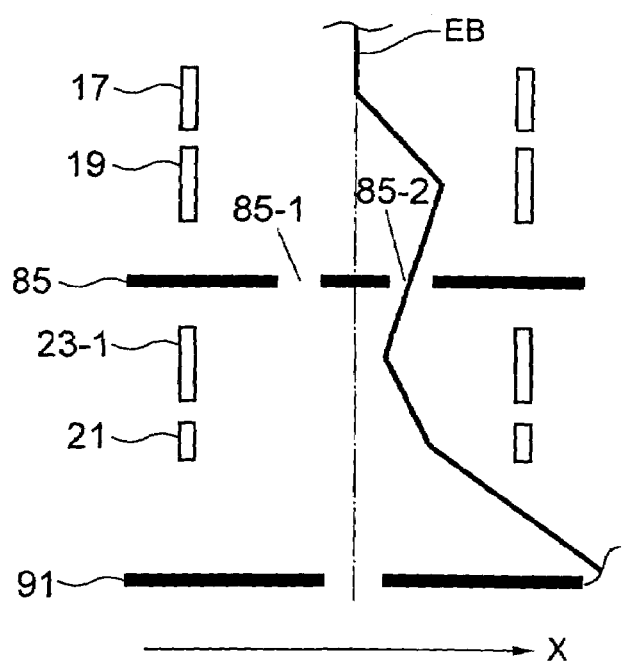
FIG. 12 is a diagram showing one example of the charged beam trajectory during blanking of the charged beam exposure apparatus shown in FIG. 1.
Figure 13:
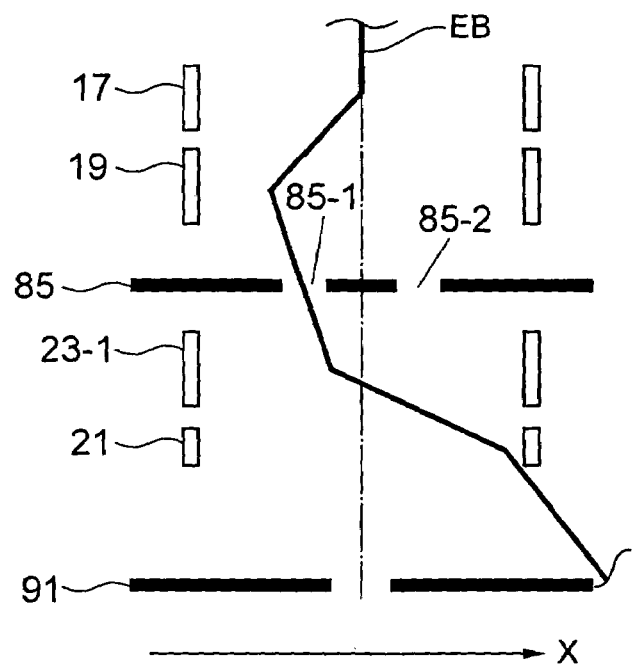
FIG. 13 is a diagram showing another example of the charged beam trajectory during the blanking of the charged beam exposure apparatus shown in FIG. 1.
Figure 14:
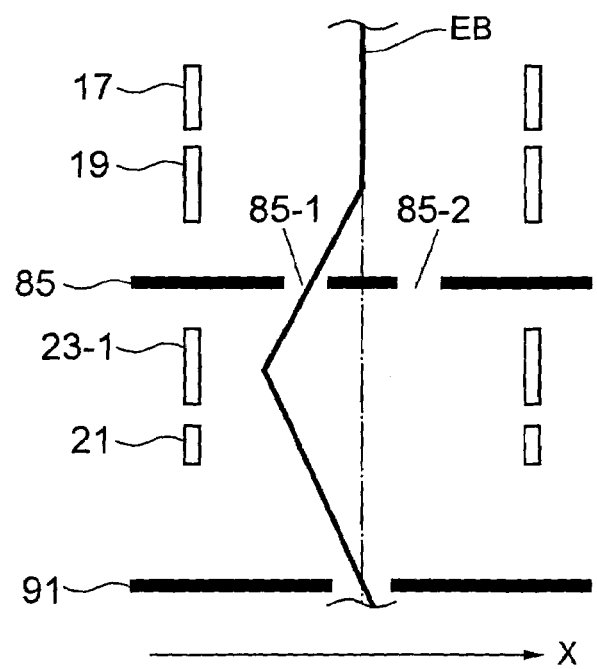
FIG. 14 is a diagram showing one example of the charged beam trajectory when an error has occurred during the blanking shown in FIG. 13.

As a typical example of occurrence of the blanking error, there is a case where a blanking direction is set in the X-axis direction and the selection of the rectangular opening of the first shaping aperture 85 (see FIG. 3) is also changed in the X-axis direction. If the opening in the first shaping aperture arranged in the X-axis direction is selected in a state where the electron beam EB is blanked in the X-axis direction, this results in the beam trajectories, for example, as shown in FIG. 12 and FIG. 13. At this point, if predetermined error conditions are satisfied, for example, if the voltage of the selective deflector 19 rises before those of the selective deflector 17 and the reversing deflector 21, the electron beam EB will pass through the blanking aperture 91, for example, as shown in FIG. 14, even though it is blanked, with the result that a photoresist on the wafer S is exposed to light.

Figure 15:
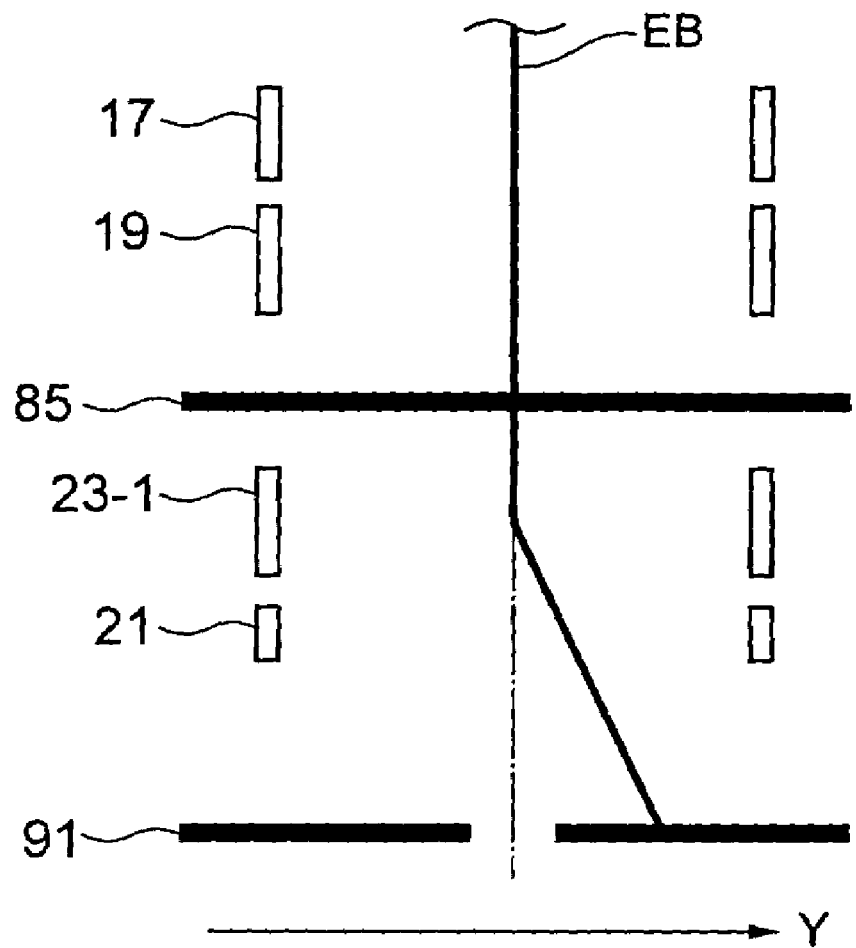
FIG. 15 is one example of a charged beam trajectory diagram explaining a method of avoiding the blanking error using the charged beam exposure apparatus shown in FIG. 1.

In order to avoid such a blanking error, in the present embodiment, the control computer 7 controls the respective power sources so that the direction in which the rectangular opening of the first shaping aperture is selected and the blanking direction of the electron beam EB are orthogonal to each other. As shown in FIG. 15, for example, when the blanking is performed in the Y-axis direction, the direction in which the rectangular opening of the first shaping aperture is selected is set in the X-axis direction. Thus, according to the present embodiment, the blanking error can be avoided by independently controlling the trajectory in which the opening of the first shaping aperture is selected and the blanking trajectory.

(2) Second Embodiment

Figure 16:
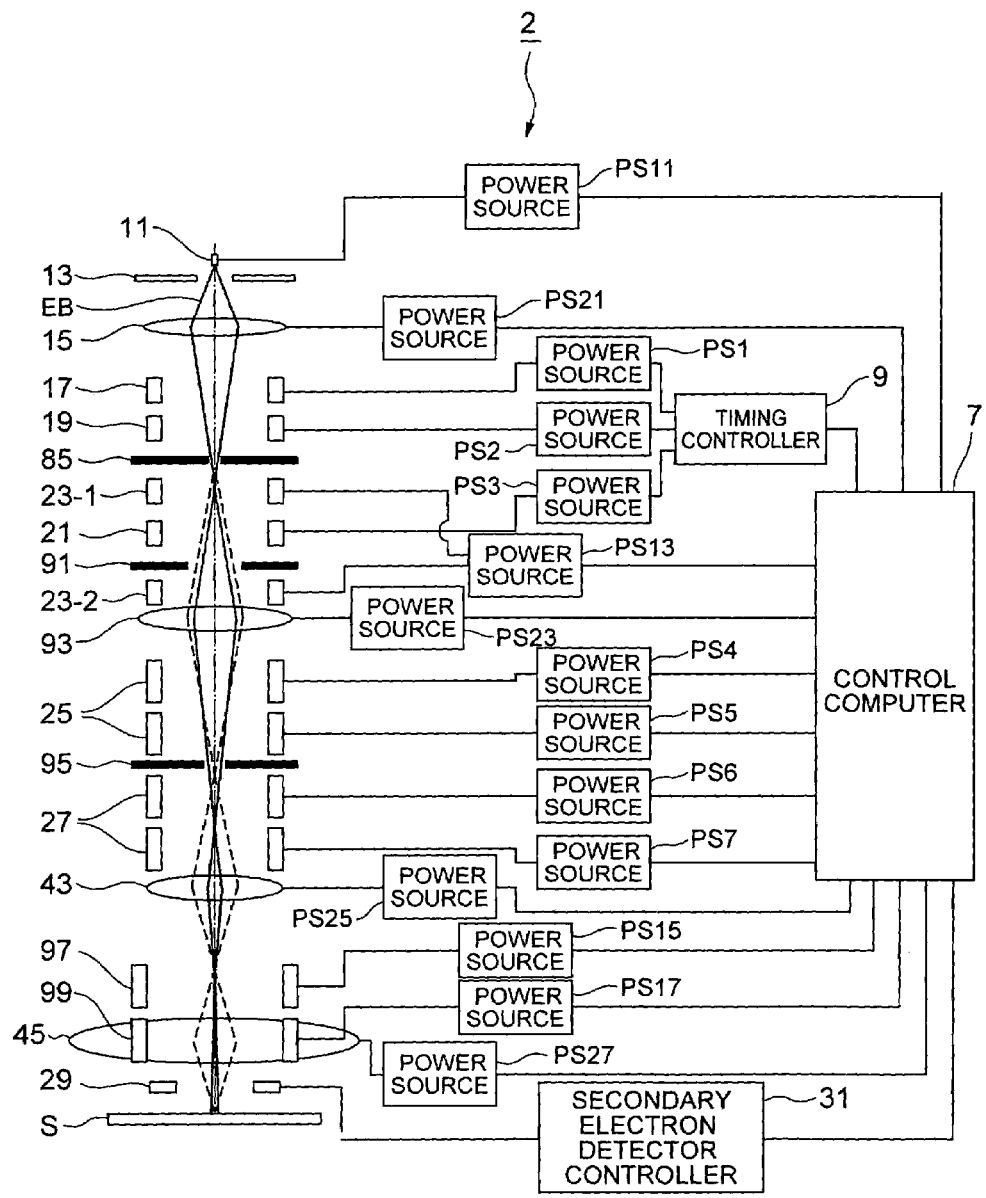
FIG. 16 is a block diagram showing a schematic configuration of a charged beam exposure apparatus according to a second embodiment of the present invention.

FIG. 16 is a block diagram showing a schematic configuration of a charged beam exposure apparatus according to a second embodiment of the present invention. In the present embodiment, another means for avoiding the blanking error described above is provided, and in addition, an arbitrary opening in a first shaping aperture is selected in accordance with a requested resolution as described above. As apparent from comparison with FIG. 1, an electron beam exposure apparatus 2 shown in FIG. 16 further comprises a timing controller 9 whose one end is connected to a control computer 7 and whose other end is connected to power sources PS1 to PS3. The timing controller 9 corresponds to, for example, a timing control unit in the present embodiment. The timing controller 9 receives a command signal of the control computer 7, and adjusts output timing of applied voltages by the power sources PS1 to PS3 so that selective deflection by selective deflectors 17, 19 and reversing deflection by a reversing deflector 21 are performed at different timings from each other. Other configurations of the electron beam exposure apparatus 2 in the present embodiment are substantially the same as those of the electron beam exposure apparatus 1 shown in FIG. 1.

A control operation of deflection timing for the three deflectors 17, 19, 21 by the timing controller 9 will be described referring to the drawings.

Figure 17:
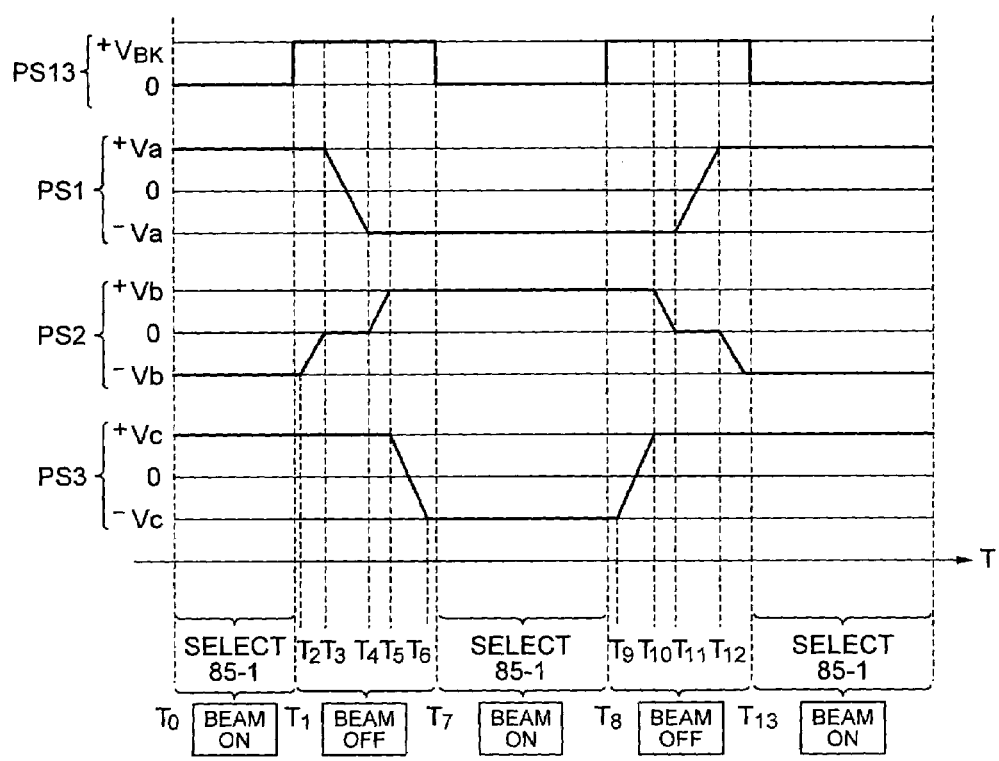
FIG. 17 is a timing chart showing one example of a method of controlling deflection timing of two selective deflectors and a reversing deflector in the charged beam exposure apparatus shown in FIG. 16.

FIG. 17 is a timing chart showing one example of deflection timing control by the timing controller 9 of the electron beam exposure apparatus 2 shown in FIG. 16. Now, at time T0, an electron beam EB illuminates a rectangular opening 85-1 of a first shaping aperture 85 (see FIG. 10, the electron beam EB is turned on), and from this state, the electron beam EB moves to a state in which it illuminates a rectangular opening 85-2. First, at time T1, the command signal is given from the timing controller 9 to a power source PS13 to apply a blanking voltage VBK to blanking electrodes 23-1, 23-2. Thus, the electron beam EB is deflected to the outside of an optical axis, and does not pass through a blanking aperture 91 (see FIG. 13, the electron beam EB is turned off). Next, at time T2, a control signal which brings an output voltage of the power source PS2 to 0 [V] is input from the timing controller 9 to the power source PS2. Then, at time T3, a control signal which decreases an output voltage of the power source PS1 to −Va [V] is output from the timing controller 9 to the power source PS1. Subsequently, at timing corresponding to time T4 when the output voltage of the power source PS1 becomes −Va [V], a control signal is output from the timing controller 9 to the power source PS2 so that the output voltage of the power source PS2 starts increasing from 0 [V] to +Va [V]. Then, at timing T5 when the output voltage of the power source PS2 becomes +Vb [V], a control signal is output from the timing controller 9 to the power source PS3 so that the output voltage of the power source PS3 is decreased from +Vc [V] to −Vc [V]. This results in a state where the rectangular opening 85-2 is selected (see FIG. 12). Further, at time T7, a control signal is given from the timing controller 9 to the power source PS13 so that the blanking voltage applied to the blanking electrodes 23-1, 23-2 becomes 0, whereby the electron beam EB irradiates a wafer S through the opening of the blanking aperture 91 (see FIG. 9, the electron beam EB is turned on).

For the timing control to change the selection from the rectangular opening 85-2 to 85-1, a procedure substantially reverse to the procedure described above can be performed. That is, at time T8, a voltage applied to the power source PS13 is increased from 0 [V] to +VBK [V] to turn off the electron beam EB (see FIG. 12). At time T9, an increase of the output voltage of the power source PS3 is started. At time T10 when the output voltage of the power source PS3 has reached +Vc [V] from −Vc [V], the output voltage of the power source PS2 is dropped from +Vb [V] to 0 [V]. At time T11 when the output voltage of the power source PS2 has reached 0 [V], an increase of the output voltage of the power source PS1 is started. At time T12 when the output voltage of the power source PS1 has reached +Va [V], the output voltage of the power source PS2 is dropped from 0 [V] to −Vp [V]. This results in a state where the rectangular opening 85-1 of the first shaping aperture 85 is selected (see FIG. 13). Finally, at time T13, the voltage applied to the power source PS13 is dropped from +VBK [V] to 0 [V], whereby the electron beam EB is turned on, and the electron beam EB irradiates the wafer S through the opening of the blanking aperture 91 (see FIG. 10).

Figure 6:
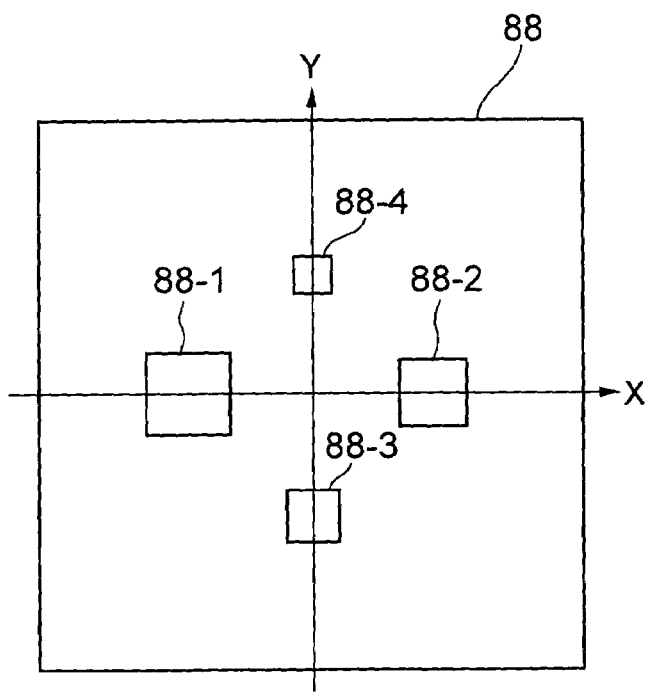
Figure 7:
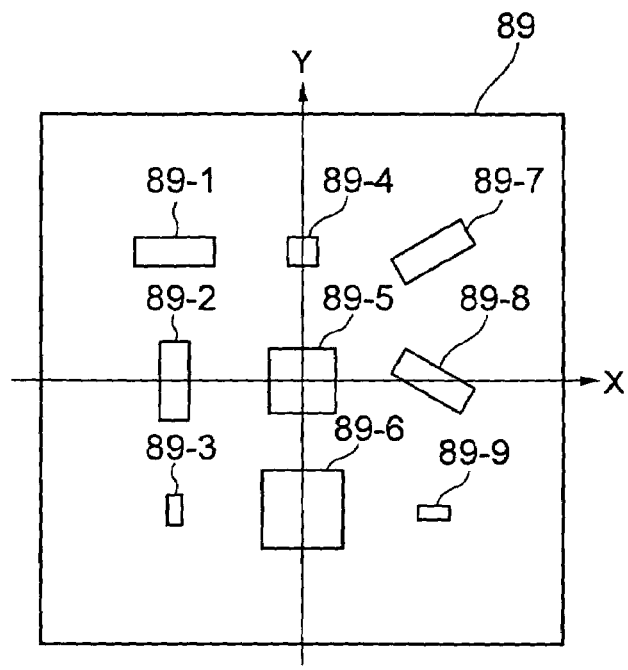

The present embodiment ensures that the blanking error can be avoided even when the rectangular opening is selected in both the X-axis direction and the Y-axis direction, for example, when a first shaping aperture 88 shown in FIG. 6 is used.

(3) Manufacturing Method of Semiconductor Device

By drawing a pattern on a substrate using the charged beam control method in the first embodiment described above, the space charge effect which can be caused between the first shaping aperture and the second shaping aperture can be decreased when a high resolution is required. On the other hand, when the high resolution is not required, the shot size can be increased to shorten the drawing time, and the pattern can be drawn with a resolution conforming to requirements/specifications. Thus, it is possible to flexibly accommodate the trade-off relation between product accuracy and manufacturing cost in manufacturing of semiconductor devices.

Furthermore, an error in the blanking deflection can be accurately avoided by drawing a pattern on the substrate using the charged beam control method in the second embodiment described above, and it is therefore possible to manufacture the semiconductor devices at a high yielding percentage.

While some of the embodiments of the present invention have been described above, the present invention is not limited to the embodiments described above, and it goes without saying that various modifications can be made within the scope thereof to implement the invention. For example, in the embodiments described above, the two-stage selective deflector and the one-stage reversing deflector are used to select the rectangular opening in the first shaping aperture. However, the number of deflectors is not limited to that of the above combination, and for example, a two-stage selective deflector and a two-stage reversing deflector may be used to select the opening. In this case, any one of the blanking error avoiding methods described above can be applied to avoid leakage of the electron beam EB. The selective deflector and the reversing deflector are not specifically limited, and both electrostatic and magnetic deflectors can also be used.

What is claimed is:

1. A charged beam exposure apparatus comprising:
   a first shaping aperture provided with a plurality of rectangular openings which are different from each other in at least one of area and shape thereof;
   a second shaping aperture provided with a pattern having a shape corresponding to that of a pattern to be drawn onto a substrate;
   a charged beam generator which generates a charged beam to apply the charged beam to the first shaping aperture;
   a projector which projects the charged beam that has passed through an arbitrary opening of the first shaping aperture onto the second shaping aperture;
   a deflection unit provided between the charged beam generator and the projector to deflect the charged beam;
   a deflection controller which controls the deflection unit so that the opening of the first shaping aperture is selected which enables adjustments of a drawing time and a resolution conforming to requirements/specifications of the pattern to be drawn; and
   a demagnification projector which projects the charged beam that has passed through the second shaping aperture onto the substrate in a demagnification form.

2. The charged beam exposure apparatus according to claim 1,
   wherein the deflection controller controls the deflection unit so that the opening having the smallest area among the openings of the first shaping aperture is selected which enables the charged beam passing through the opening of the first shaping aperture to illuminate an arbitrary area on the second shaping aperture.

3. The charged beam exposure apparatus according to claim 1,
   wherein the deflection controller controls the deflection unit so that the opening is selected in accordance with the resolution required for the pattern to be drawn.

4. The charged beam exposure apparatus according to claim 1,
   wherein the deflection controller controls the deflection unit so that the opening is selected which minimizes a current amount of a portion of the charged beam shut off by the second shaping aperture.

5. The charged beam exposure apparatus according to claim 1, further comprising:
   a focus position corrector to correct displacement in a focal position in the second shaping aperture which might occur depending on the selected opening.

6. The charged beam exposure apparatus according to claim 1,
   wherein the openings are a plurality of rectangular openings having different areas, and if an optical axis of the charged beam is an Z axis, the openings are arranged on an X axis to be substantially in line symmetry with respect to a Y axis.

7. The charged beam exposure apparatus according to claim 1,
   wherein the openings are a plurality of rectangular openings having different areas, and if the optical axis of the charged beam is in a Z-axis direction, the openings are arranged on the X axis and the Y axis to be rotationally symmetric around an intersection of the X axis and the Y axis.

8. The charged beam exposure apparatus according to claim 7,
   wherein the openings of the first shaping aperture also include openings arranged away from the X axis and the Y axis.

9. A charged beam exposure apparatus comprising:
   a first shaping aperture provided with a plurality of rectangular openings which are different from each other in at least one of area and shape thereof;
   a second shaping aperture provided with a pattern having a shape corresponding to that of a pattern to be drawn onto a substrate;
   a charged beam generator which generates a charged beam to apply the charged beam to the first shaping aperture;
   a projector which projects the charged beam that has passed through an arbitrary opening of the first shaping aperture onto the second shaping aperture;
   a deflection unit provided between the charged beam generator and the projector to deflect the charged beam;
   a blanking unit which selectively controls turning on/off of application of the charged beam to the substrate by deflecting the charged beam;
   a deflection controller which controls the deflection unit so that the charged beam is deflected in a direction orthogonal to a direction of deflection by the blanking unit to cause the charged beam to selectively pass through the arbitrary opening; and
   a demagnification projector which projects the charged beam that has passed through the second shaping aperture onto the substrate in a demagnification form.

10. A charged beam exposure apparatus comprising:
    a first shaping aperture provided with a plurality of rectangular openings which are different from each other in at least one of area and shape thereof;
    a second shaping aperture provided with a pattern having a shape corresponding to that of a pattern to be drawn onto a substrate;
    a charged beam generator which generates a charged beam to apply the charged beam to the first shaping aperture;
    a projector which projects the charged beam that has passed through an arbitrary opening of the first shaping aperture onto the second shaping aperture;
    a demagnification projector which projects the charged beam that has passed through the second shaping aperture onto the substrate in a demagnification form;
    a blanking unit which selectively controls turning on/off of application of the charged beam to the substrate by deflecting the charged beam;
    a deflection unit including first and second deflectors disposed closer to the charged beam generator side than the first shaping aperture in an optical axis direction of the charged beam to apply the charged beam to the arbitrary opening by deflecting the charged beam, and further including a third deflector disposed closer to the substrate side than the first shaping aperture to reverse the charged beam that has passed through the opening to the optical axis side;

a deflection controller which controls the deflection unit so that the charged beam selectively passes through the arbitrary opening; and a timing control unit which controls the deflection unit so that the first to third deflectors operate at different timings.

11. A charged beam control method comprising:

generating a charged beam and applying the charged beam to an arbitrary opening of a first shaping aperture provided with a plurality of rectangular openings which are different from each other in at least one of area and shape thereof;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form; and deflecting the charged beam so that the opening of the first shaping aperture is selected as an opening of the first shaping aperture through which the charged beam passes to enable adjustments of a drawing time and a resolution conforming to requirements/specifications of the pattern to be drawn.

12. The charged beam control method according to claim 11, wherein the charged beam is deflected so that the opening having the smallest area among the openings of the first shaping aperture is selected which enables the charged beam passing through the opening of the first shaping aperture to illuminate an arbitrary area on the second shaping aperture.

13. The charged beam control method according to claim 11, wherein the charged beam is deflected so that the opening of the first shaping aperture is selected in accordance with the resolution required for the pattern to be drawn.

14. The charged beam control method according to claim 11, wherein the charged beam is deflected so that the opening of the first shaping aperture is selected which minimizes a current amount of a portion of the charged beam shut off by the second shaping aperture.

15. The charged beam control method according to claim 11, wherein the charged beam passes through the first shaping aperture to be projected as a rectangular beam onto the second shaping aperture, and the rectangular beam is superposed on a rectangular opening provided in the second shaping aperture, thereby forming a shape of the charged beam to be projected onto the substrate.

16. A charged beam control method comprising:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam; and deflecting the generated charged beam in a direction orthogonal to a direction of deflection by the blanking deflection to cause the charged beam to selectively pass through the arbitrary opening of the first shaping aperture.

17. A charged beam control method comprising:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam;

a first and a second deflections to deflect the charged beam so that the generated charged beam selectively passes through the arbitrary opening of the first shaping aperture, and a third deflection to reverse the charged beam that has passed through the arbitrary opening to the optical axis side; and carrying out the first to third deflections at different timings.

18. A manufacturing method of a semiconductor device comprising drawing a pattern on a substrate by use of a charged beam control method which includes:

generating a charged beam and applying the charged beam to an arbitrary opening of a first shaping aperture provided with a plurality of rectangular openings which are different from each other in at least one of area and shape thereof;

projecting the charged beam that has passed through the arbitrary opening of the first shaping aperture to a second shaping aperture provided with a pattern having a shape corresponding to that of the pattern to be drawn onto the substrate;

projecting the charged beam that has passed through the pattern of the second shaping aperture onto the substrate in a demagnification form; and deflecting the charged beam so that the opening of the first shaping aperture is selected as an opening of the first shaping aperture through which the charged beam passes to enable adjustments of a drawing time and a resolution conforming to requirements/specifications of the pattern to be drawn.

19. A manufacturing method of a semiconductor device comprising drawing a pattern on a substrate by use of a charged beam control method which includes:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam; and deflecting the generated charged beam in a direction orthogonal to a direction of deflection by the blanking deflection to cause the charged beam to selectively pass through the arbitrary opening of the first shaping aperture.

20. A manufacturing method of a semiconductor device comprising drawing a pattern on a substrate by use of a charged beam control method which includes:

generating a charged beam and applying the charged beam to an arbitrary opening of a first shaping aperture provided with a plurality of openings;

projecting the charged beam that has passed through the arbitrary opening of the first shaping aperture to a second shaping aperture provided with a pattern having a shape corresponding to that of a pattern to be drawn onto a substrate;

projecting the charged beam that has passed through the pattern of the second shaping aperture onto the substrate in a demagnification form;

blanking deflection to selectively control turning on/off of application of the charged beam to the substrate by deflecting the charged beam;

a first and a second deflections to deflect the charged beam so that the generated charged beam selectively passes through the arbitrary opening of the first shaping aperture, and a third deflection to reverse the charged beam that has passed through the arbitrary opening to the optical axis side; and carrying out the first to third deflections at different timings.

* * * * *